US010034411B2

(12) United States Patent
Prather et al.

(10) Patent No.: US 10,034,411 B2
(45) Date of Patent: Jul. 24, 2018

(54) THERMAL FLOW ASSEMBLY INCLUDING INTEGRATED FAN

(71) Applicant: Apple Inc., Cupertino, CA (US)

(72) Inventors: Eric R. Prather, Santa Clara, CA (US); Clark E. Waterfall, Campbell, CA (US); Reuben J. Williams, San Francisco, CA (US); Vinh H. Diep, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 4 days.

(21) Appl. No.: 15/199,460

(22) Filed: Jun. 30, 2016

(65) Prior Publication Data

US 2017/0094835 A1 Mar. 30, 2017

Related U.S. Application Data

(60) Provisional application No. 62/233,261, filed on Sep. 25, 2015.

(51) Int. Cl.

| H05K 7/20 | (2006.01) |
| F28D 15/02 | (2006.01) |
| H01L 23/427 | (2006.01) |
| F28F 1/12 | (2006.01) |
| H01L 23/467 | (2006.01) |

(52) U.S. Cl.
CPC ..... *H05K 7/20154* (2013.01); *F28D 15/0233* (2013.01); *H01L 23/427* (2013.01); *F28F 1/12* (2013.01); *F28F 2250/08* (2013.01); *H01L 23/467* (2013.01)

(58) Field of Classification Search
CPC ............ H05K 7/20154; F28D 15/0233; H01L 23/427; F28F 1/12; F28F 2250/08
See application file for complete search history.

(56) References Cited

U.S. PATENT DOCUMENTS

| 6,118,655 A | 9/2000 | Mecredy, III et al. |
| 6,421,239 B1 * | 7/2002 | Huang ................. H01L 23/467 165/104.33 |
| 6,459,577 B1 * | 10/2002 | Holmes ..................... G06F 1/20 165/80.3 |
| 6,695,041 B2 | 2/2004 | Lai et al. |
| 6,725,906 B2 * | 4/2004 | Lin .......................... G06F 1/20 165/121 |
| 7,447,030 B2 * | 11/2008 | Hwang ............... F28D 15/0233 165/104.33 |

(Continued)

*Primary Examiner* — David M Sinclair
*Assistant Examiner* — Robert Brown
(74) *Attorney, Agent, or Firm* — Kilpatrick Townsend & Stockton

(57) ABSTRACT

An electronic device includes an outer housing having an upper enclosure and a foot coupled thereto, a heat generating component, and a fan assembly integrated into the foot and situated proximate a bottom surface of the heat generating component. The foot can include inlet and outlet vents. The fan assembly can include an inlet, outlet, impeller with blades, shroud and fin stack. The electronic device can also include a heat pipe, a heat transfer stage, a PCB, and a bottom shield. Airflow through the electronic device can be directed across the fin stack, heat pipe, heat transfer stage, and bottom shield. Airflow can occur over a substantially level path through the electronic device from the inlet to outlet vents.

18 Claims, 10 Drawing Sheets

(56) References Cited

U.S. PATENT DOCUMENTS

| | | | |
|---|---|---|---|
| 7,573,714 B2 | 8/2009 | Ali | |
| 7,589,965 B2 * | 9/2009 | Liang | H05K 7/20154 165/104.33 |
| 8,072,754 B2 * | 12/2011 | Zhang | F04D 29/4226 165/122 |
| 8,837,139 B2 * | 9/2014 | Qin | G06F 1/203 165/80.4 |
| 2008/0043436 A1 * | 2/2008 | Hung | G06F 1/20 361/700 |
| 2008/0053642 A1 * | 3/2008 | Hwang | F28D 15/0233 165/120 |
| 2009/0180253 A1 | 7/2009 | Chang et al. | |
| 2009/0290307 A1 * | 11/2009 | Hwang | F04D 17/16 361/695 |
| 2010/0091442 A1 * | 4/2010 | Theobald | G06F 1/1616 361/679.09 |
| 2011/0304976 A1 * | 12/2011 | Knopf | G06F 1/181 361/679.47 |
| 2014/0361672 A1 * | 12/2014 | Whang | G06F 3/00 312/223.2 |

* cited by examiner

THERMAL FLOW ASSEMBLY INCLUDING INTEGRATED FAN

CROSS-REFERENCE TO RELATED APPLICATION

This application claims the benefit of U.S. Provisional Patent Application No. 62/233,261, filed on Sep. 25, 2015, which is incorporated by reference herein in its entirety for all purposes.

FIELD

The described embodiments relate generally to electronic devices, and more particularly to thermal management features for electronic devices.

BACKGROUND

Electronic devices contain components that produce heat during normal operation. Fans, heat sinks, and other heat diversion components are thus well-known and common features in many electronic devices. As might be expected though, increasingly faster and more powerful chips and integrated circuitry can generate more heat than previous generations of devices. Coupled with the desire to put these components into smaller overall volumes, this can create new challenges. Existing thermal management features and techniques can sometimes fall behind in the face of increasing demands to account for more heat using less volume than before. Even where minimal thermal requirements are met for a given electronic device, the overall performance of the device can be enhanced where its generated heat is well dispersed beyond the minimums that are required.

While current thermal management features and techniques for electronic devices have worked well in the past, there is often room for improvement. Accordingly, there is a need for improved heat dissipation features and techniques in electronic devices.

SUMMARY

Representative embodiments set forth herein disclose various features and techniques for managing heat dissipation in an electronic device. In particular, the disclosed embodiments set forth electronic devices having low profile thermal flow assemblies including integrated fans, as well as the thermal flow assemblies, and also methods for cooling an electronic device.

According to various embodiments, an electronic device includes an outer housing having an upper enclosure and a foot coupled thereto, a heat generating component, and a fan assembly integrated into the foot. The fan can be situated proximate a bottom surface of the heat generating component. The foot can include inlet and outlet vents. The fan assembly can include an inlet, outlet, impeller with blades, shroud and fin stack. The electronic device can also include a heat pipe, a heat transfer stage, a PCB, and a bottom shield. Airflow through the electronic device can be directed across the fin stack, heat pipe, heat transfer stage, and bottom shield, and the airflow can occur over a substantially level path from the inlet to outlet vents.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described will become apparent from the following Detailed Description, Figures, and Claims.

Other aspects and advantages of the embodiments described herein will become apparent from the following detailed description taken in conjunction with the accompanying drawings which illustrate, by way of example, the principles of the described embodiments.

BRIEF DESCRIPTION OF THE DRAWINGS

The included drawings are for illustrative purposes and serve only to provide examples of possible structures and arrangements for the disclosed features and techniques for managing heat dissipation in an electronic device. These drawings in no way limit any changes in form and detail that may be made to the embodiments by one skilled in the art without departing from the spirit and scope of the embodiments. The embodiments will be readily understood by the following detailed description in conjunction with the accompanying drawings, wherein like reference numerals designate like structural elements.

DETAILED DESCRIPTION

Representative applications of apparatuses and methods according to the presently described embodiments are provided in this section. These examples are being provided solely to add context and aid in the understanding of the described embodiments. It will thus be apparent to one skilled in the art that the presently described embodiments can be practiced without some or all of these specific details. In other instances, well known process steps have not been described in detail in order to avoid unnecessarily obscuring the presently described embodiments. Other applications are possible, such that the following examples should not be taken as limiting.

Electronic devices contain components that produce heat during normal operation. As such, fans, heat sinks, and other heat diversion components are a well-known and common part of the electronics landscape. Increasingly faster and more powerful circuitry can generate increased levels of heat, while space constraints are often shrinking, both of which can create new challenges. Accordingly, there is a need for improved heat dissipation features and techniques in electronic devices.

According to various embodiments, an electronic device includes an outer housing having an upper enclosure and a foot, a heat generating component, and a fan assembly integrated into the foot and situated proximate the heat generating component bottom surface. The foot can include inlet and outlet vents, while the fan assembly can include an inlet, outlet, impeller with blades, shroud and fin stack. The electronic device can also include a heat pipe, a heat transfer stage, a PCB, and a bottom shield. Airflow through the electronic device can be directed across the fin stack, heat pipe, heat transfer stage, and bottom shield, and the airflow can occur over a substantially level path from the inlet to outlet vents.

The foregoing approaches provide features and techniques for managing heat dissipation in an electronic device, such as by using a low profile thermal flow assembly. A more detailed discussion of these features and techniques is set forth below and described in conjunction with FIGS. 1-10, which illustrate detailed diagrams of devices and components that can be used to implement these features and techniques.

Figure 1:
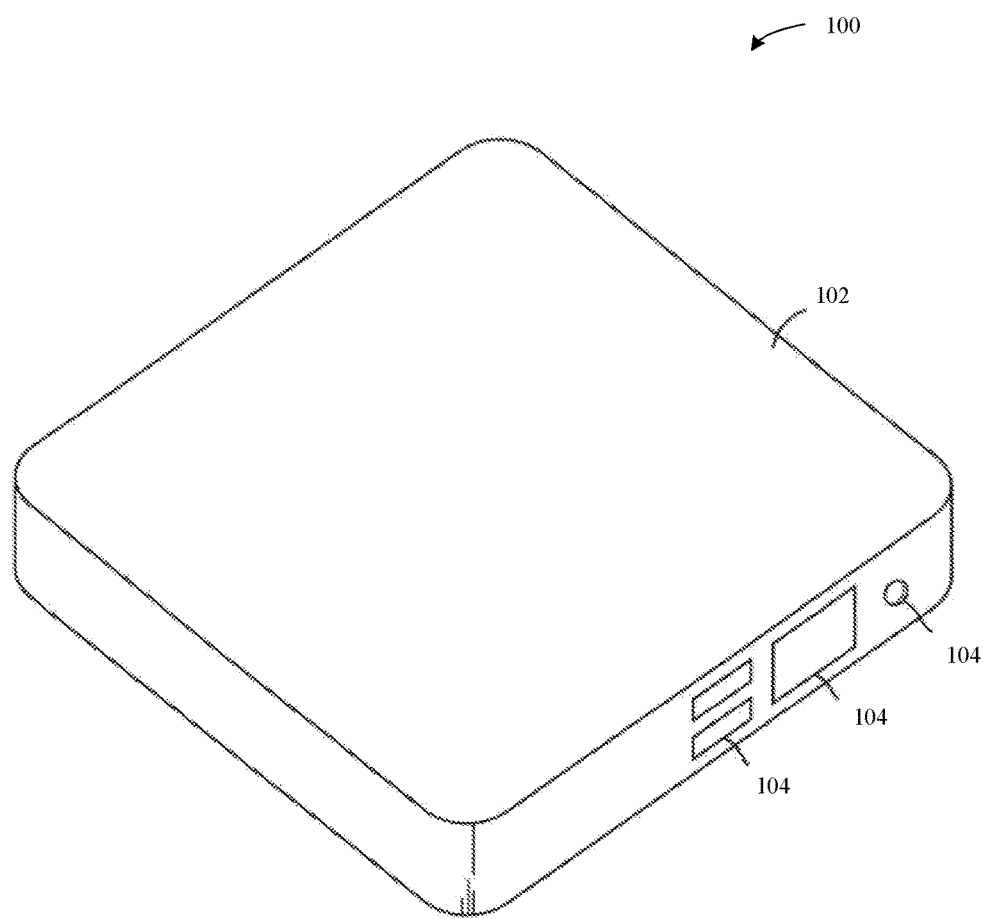
FIG. 1 illustrates in top perspective view an exemplary electronic device according to various embodiments of the present disclosure.

Turning first to FIG. 1, an exemplary electronic device according to various embodiments of the present disclosure is illustrated in top perspective view. Electronic device 100 of FIG. 1 may be a computer, a set-top box, a wireless access point, a portable electronic device, or any other suitable electronic device or piece of equipment. In various embodiments, electronic device can be a digital media extender (e.g., an Apple TV®), for example. Electronic device 100 may have an outer housing 102, which may be formed from materials such as plastic, glass, ceramic, metal, carbon fiber, fiberglass, and other fiber composites, other materials, or combinations of these materials, for example. Housing 102 may have one or more parts, such as, for example, mating upper and lower parts formed from plastic or other housing materials. If desired, housing 102 may have more than two parts.

In the configuration shown in FIG. 1, housing 102 of electronic device 100 has a rectangular box shape with planar upper and lower surfaces and four perpendicular (vertical) planar sidewalls, and the corners of housing 102 may be rounded. It will be readily appreciated that the example of FIG. 1 is merely illustrative, such that other shapes may be used for housing 102 if desired (e.g., shapes with curved sides, shapes with circular footprints, shapes with combinations of curved and straight edges and surfaces, etc.). To accommodate connectors for displays, device peripherals, power cables, and other accessories, housing 102 may have openings (e.g., port openings) such as openings 104. Electronic device 100 may also contain internal electronic components, such as integrated circuits and other components that may generate heat. Thermal management features may thus be incorporated into the internal structures of electronic device 100, and even within various components of housing 102, such as set forth in greater detail below.

Figure 2:
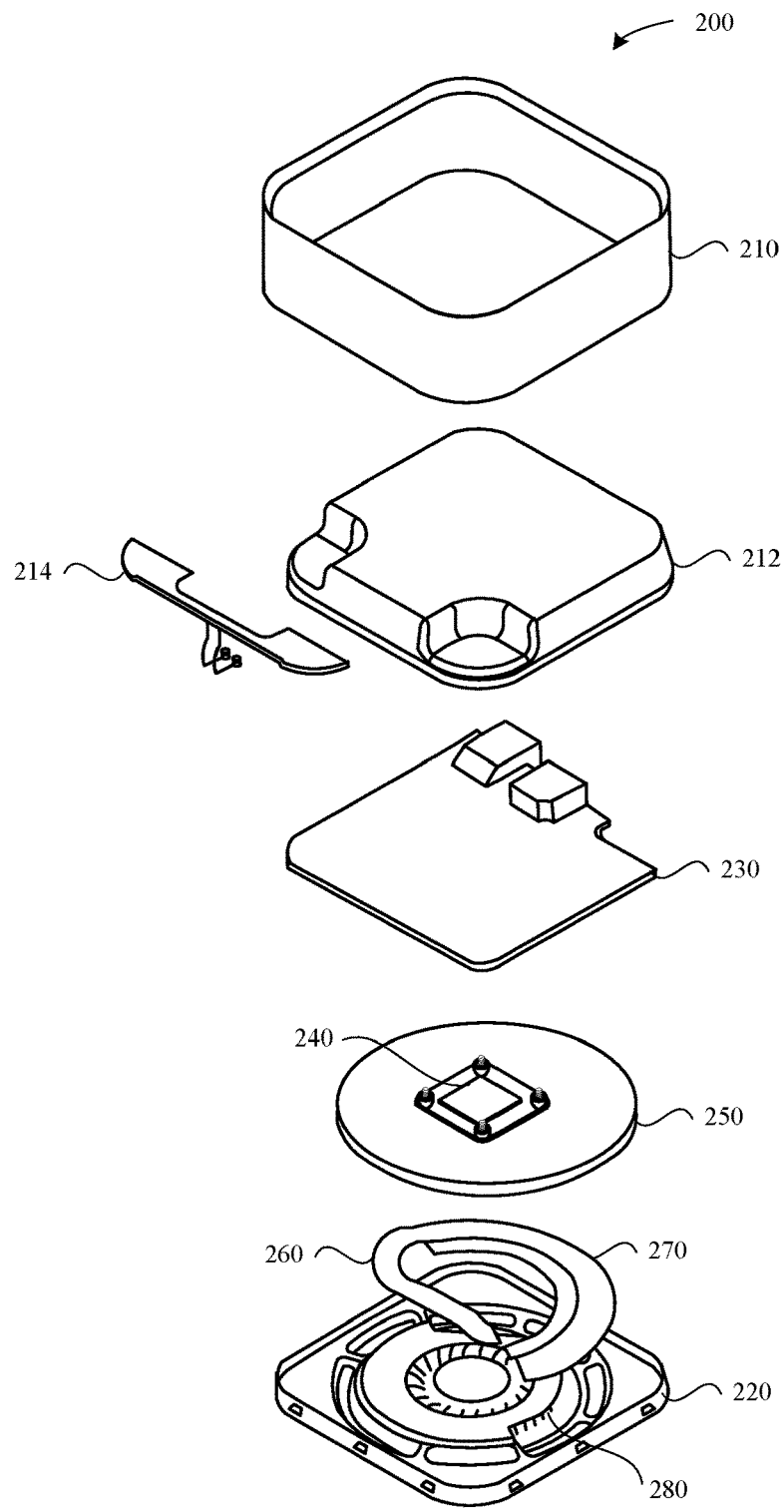
FIG. 2 illustrates in exploded perspective view an exemplary electronic device having a low profile thermal flow assembly according to various embodiments of the present disclosure.

In FIG. 2, an exemplary electronic device having a low profile thermal flow assembly is illustrated in exploded perspective view. Electronic device 200 can include an upper enclosure 210 and a foot 220 coupled thereto to form an overall outer housing. A power supply unit 212 and an internal antenna 214 can reside within an upper region of the overall outer housing, while a multi-level board 230 can reside in the overall outer housing beneath the power supply unit 212. Multi-level board 230 can include one or more heat generating components (not shown), such as a CPU and various other processing components and circuitry, as well as top and bottom shields or heat spreaders coupled thereto, among other possible items. A heat transfer stage 240 can be disposed beneath the multi-level board 230, such as directly beneath the CPU or other significant heat generating component on multi-level board 230. This can result in heat transfer stage 240 being in thermal contact with the CPU and/or other heat generating component(s), as will be readily appreciated.

An air cylinder 250 can be disposed beneath heat transfer stage 240, and can serve to limit or direct airflow within electronic device 200. In various embodiments, air cylinder 250 can form a shell or enclosure that effectively isolates or at least separates various portions of an overall low profile thermal flow assembly from other components within the overall electronic device 200. For example, a heat pipe 260 and fin stack 270 can be disposed within a volume defined by air cylinder 250, while a fan assembly 280 can be disposed beneath these components and integrated within the foot 220. In various embodiments, the heat transfer stage 240 might be considered part of an overall low profile thermal flow assembly, and the heat pipe 260 and/or fin stack 270 might be considered part of an overall fan assembly.

Figure 3A:
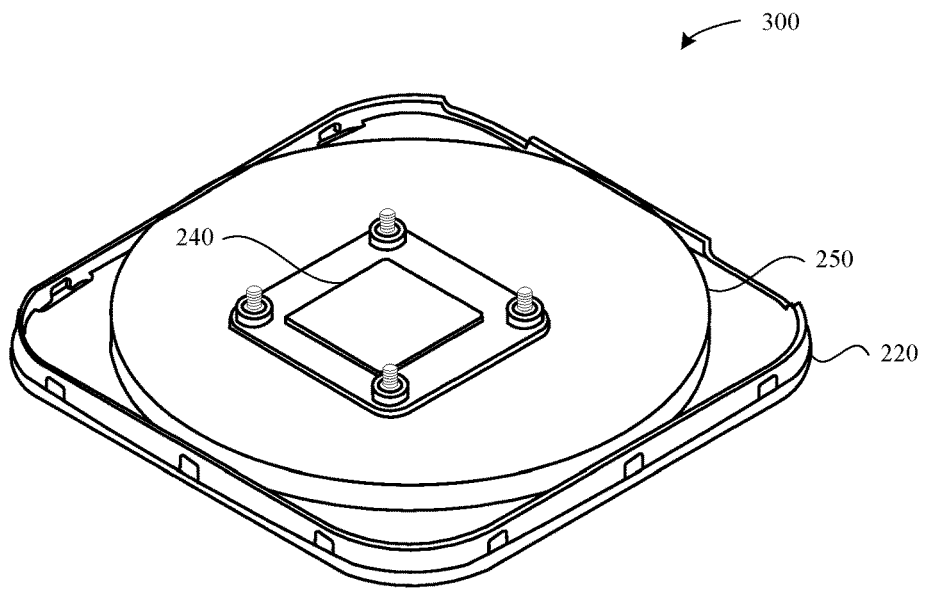
FIG. 3A illustrates in top perspective view an exemplary low profile thermal flow assembly for the electronic device of FIG. 2 according to various embodiments of the present disclosure.

Moving next to FIG. 3A, an exemplary low profile thermal flow assembly for the electronic device of FIG. 2 is shown in top perspective view. Again, a low profile thermal flow assembly 300 can include a heat transfer stage 240 disposed outside of an air cylinder 250 that contains various other assembly components disposed therein. In alternative embodiments, heat transfer stage 240 might be disposed within air cylinder 250 or another similar airflow restricting device. In either arrangement, heat transfer stage 240 can be in thermal contact with one or more components inside of the enclosure formed by air cylinder 250. These items can all be integrated with or otherwise contained within a foot 220, which again can form a part of an overall external housing for the electronic device 200.

Figure 3B:
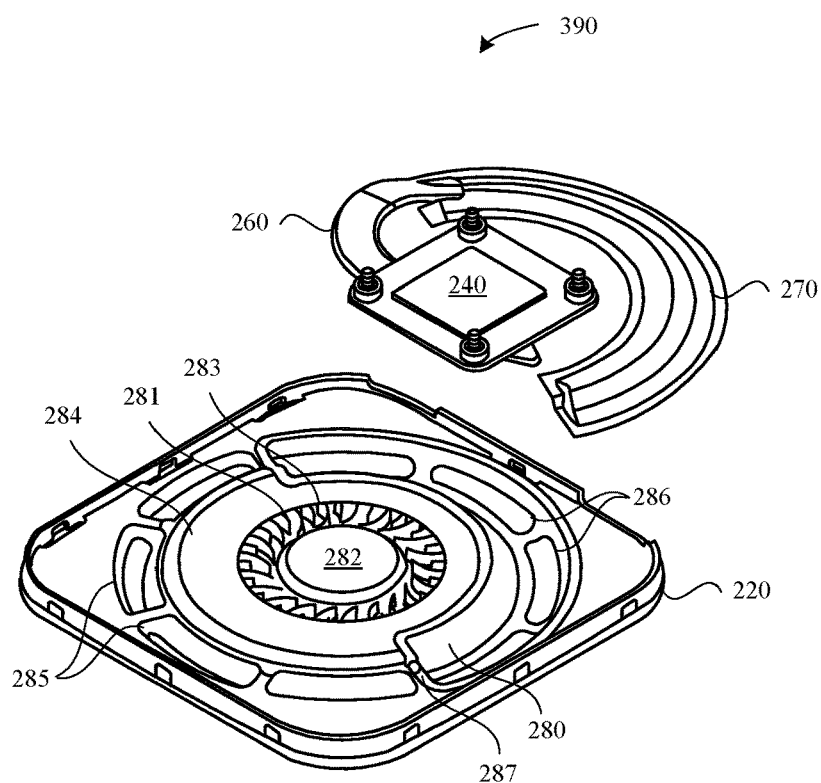
FIG. 3B illustrates in partially exploded top perspective view the low profile thermal flow assembly of FIG. 2 having an outer housing foot with integrated fan assembly according to various embodiments of the present disclosure.

FIG. 3B illustrates in partially exploded top perspective view the low profile thermal flow assembly of FIG. 2 according to various embodiments of the present disclosure. As shown in partially exploded view 390, heat pipe 260 can be disposed directly beneath and in thermal contact with heat transfer stage 240 (with air cylinder 250 potentially therebetween), such that heat pipe 260 is configured to direct heat away from a CPU or other heat generating component(s) within the multi-level board 230 disposed thereabove. Heat pipe 260 can extend from beneath heat transfer stage 240 into fin stack 270, where heat can then be exchanged with cooling air forced therethrough by an impeller 281 disposed within a fan assembly 280.

Impeller 281 can have a hub 282 and blades 283, and can rotate such that incoming cool air is pulled into and forced out of the impeller 281. A shroud 284 can force or direct airflow from one or more fan assembly inlets 285 over the top of impeller 281 and toward a central region thereof where hub 282 is located. Shroud 284 then ends as shown, such that incoming cool air is pulled into the central region of impeller 281, where rotation of blades 283 forces the air outward and into fin stack 270. Air is then heated as it is forced or directed through fin stack 270, after which the heated air is exhausted through one or more fan assembly outlets 286. One or more seals 287 can compress during the installation of fin stack 270 to fan assembly 280, and such seals 287 can limit or further direct airflow in a desirable manner.

Figure 4:
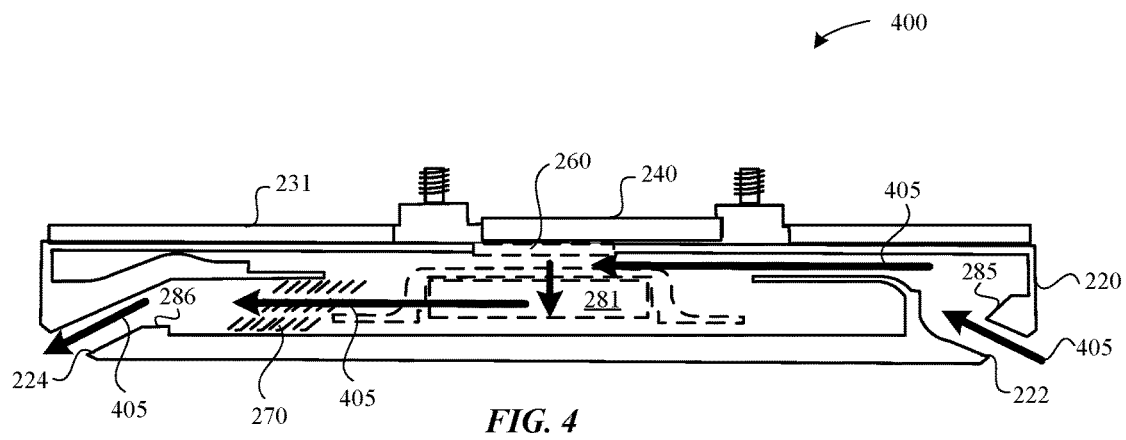
FIG. 4 illustrates in side elevation view the exemplary low profile thermal flow assembly of FIG. 3A according to various embodiments of the present disclosure.

FIG. 4 illustrates in side elevation view the exemplary low profile thermal flow assembly of FIG. 3A according to various embodiments of the present disclosure. Low profile thermal flow assembly 400 can be identical or similar to assembly 300 above, and thus can include a heat transfer stage 240 disposed outside of an air cylinder 250 that contains various other assembly components disposed therein. Foot 220 can be part of an overall outer housing for electronic device 200, and can include various thermal flow assembly items or features integrated therein. For example, one or more inlet vents 222 formed within foot 220 can allow ambient air outside of electronic device 200 to enter the device for cooling airflow purposes. Similarly, one or more outlet vents 224 formed within foot 220 can allow heated air to be exhausted from the electronic device 200.

Air coming into, through, and out of low profile thermal flow assembly 400 is generally designated as airflow 405. Air entering the device through inlet vent(s) 222 can all or mostly be directed to fan assembly inlet(s) 285, after which the air flows through the fan assembly as noted above and reaches the fan assembly outlet(s) 286. Air reaching the fan assembly outlet(s) 286 has typically been heated by this point, whereby the heated air is then generally directed toward outlet vents 224 where it is exhausted from electronic device 200. Airflow 405 through low profile thermal flow assembly 400 can exchange heat with various device components, such that the air is heated and the various device components are cooled, as will be readily appreciated. Airflow 405 can thus serve to cool, for example, a bottom shield 231 of multi-level board 230, a heat transfer stage 240, a heat pipe 260, and a fin stack 270, among other device components. Such cooling or heat exchanges can take place by way of direct or indirect contact with airflow 405.

Figure 5A:
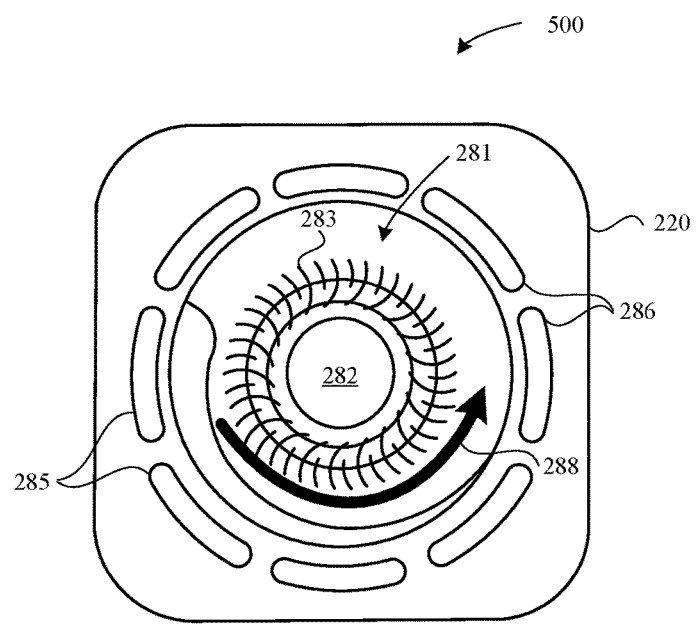
FIGS. 5A-5C illustrate in top plan views various stages of a partially assembled exemplary outer housing foot with integrated fan assembly according to various embodiments of the present disclosure.
Figure 5B:
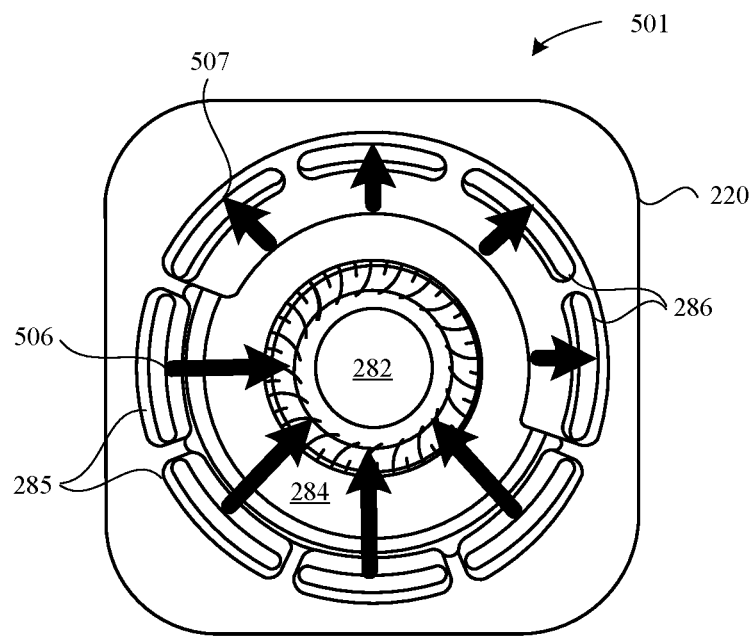
Figure 5C:
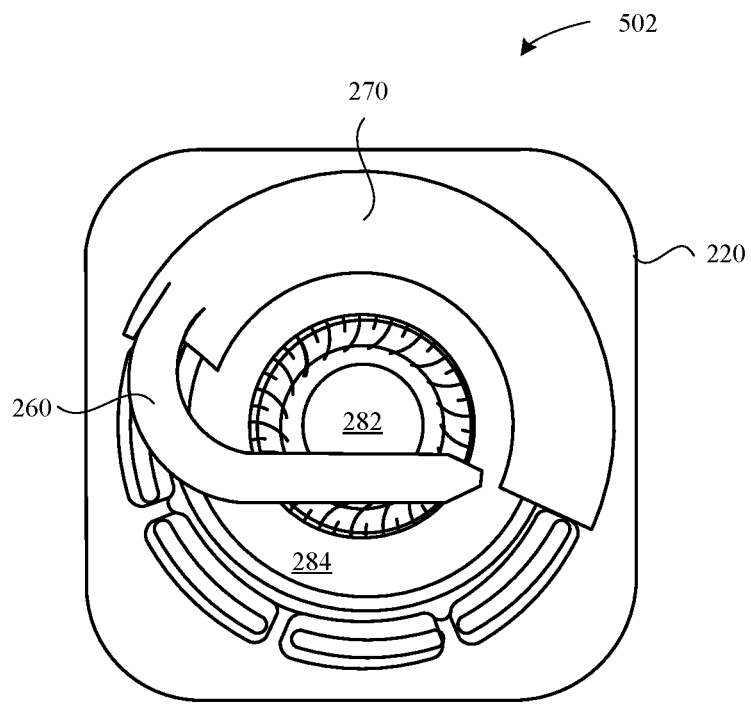

FIGS. 5A-5C illustrate in top plan views various stages of a partially assembled exemplary outer housing foot with integrated fan assembly according to various embodiments of the present disclosure. Arrangement 500 in FIG. 5A depicts an outer housing foot 220 having a fan scroll geometry integrated therein. Such fan scroll geometry items can include one or more fan assembly inlets 285, one or more fan assembly outlets 286, and an internal cavity shaped to house and facilitate the functionality of various other fan assembly items. Such other fan assembly items can include, for example, a rotatable impeller 281 having a hub 282 and blades 283 that can rotate in fan direction 288.

Arrangement 501 in FIG. 5B depicts a shroud 284 installed on top of the arrangement 500 of FIG. 5A. As shown, shroud 284 can serve to restrict airflow, effectively turning various vents and openings into inlets and outlets. Shroud 284 covers part of the top of impeller 281, such that air is forced over the top of the impeller in some locations but not others. This results in various openings within the assembly becoming fan assembly inlets 285 and other openings becoming fan assembly outlets 286. Incoming or inlet airflow(s) 506 then enter the assembly through one or more fan assembly inlets 285, and flows over the top of shroud 284 before entering the impeller near its center or hub 282. The air is then forced out of the impeller during rotation, as shown by outgoing or exhaust airflow(s) 507 exiting the side of the impeller and proceeding through one or more fan assembly outlets 286.

Arrangement 502 in FIG. 5C depicts a heat pipe 260 and a fin stack 270 installed onto the arrangement 502 of FIG. 5B. As shown, heat pipe 260 can extend from above hub 282 down into the fin stack 270, such that heat is transferred from above the hub 282 (e.g., from heat transfer stage 240) down into the fin stack 270. Outgoing or exhaust airflow can then be forced through the fin stack 270 before it is exhausted from the fan assembly and device entirely, with such an interaction between the outgoing airflow and the fin stack 270 resulting in a significant exchange of heat that heats the air before it is exhausted.

Figure 6:
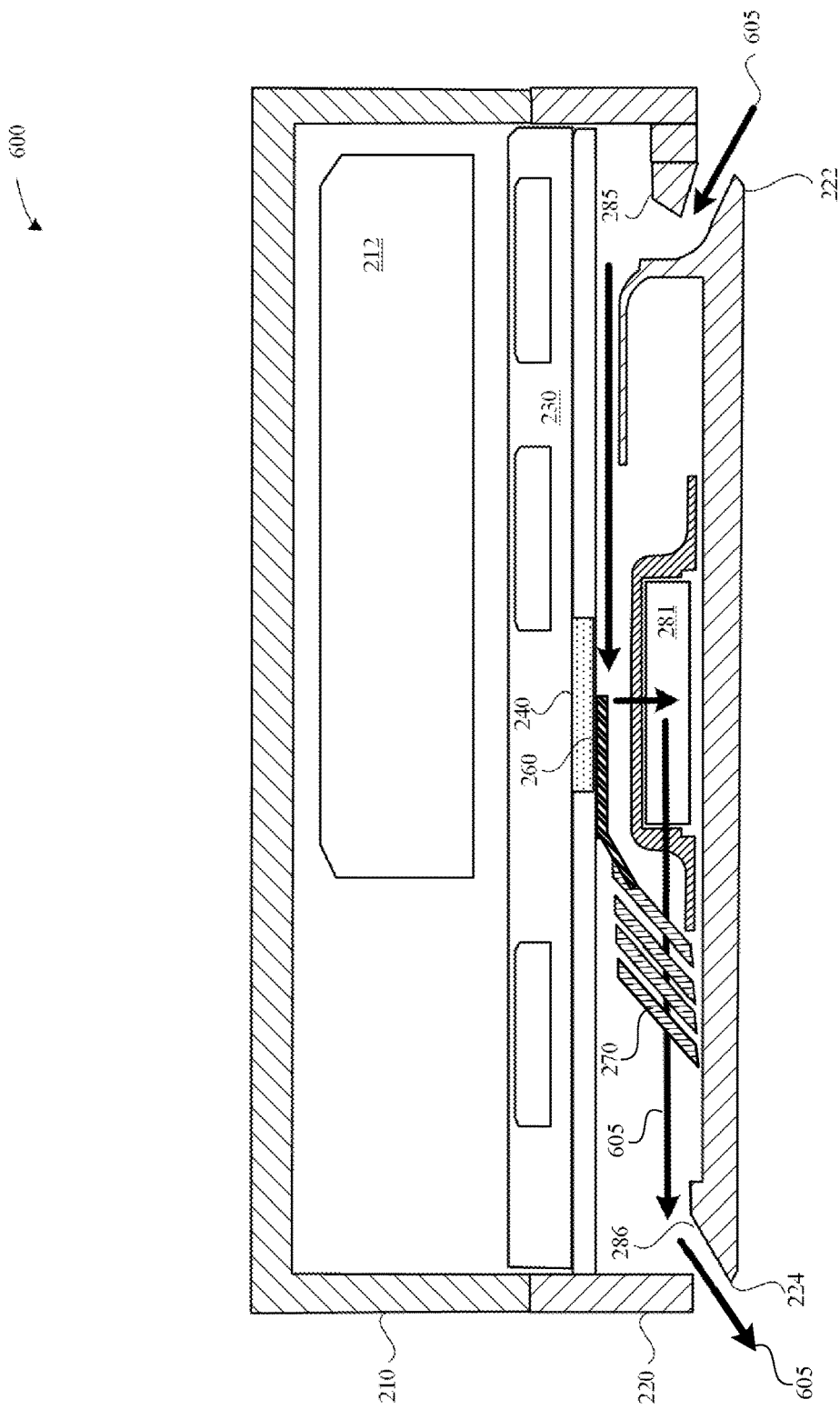
FIG. 6 illustrates in side cross-sectional view an exemplary electronic device having a low profile thermal flow assembly according to various embodiments of the present disclosure.

FIG. 6 illustrates in side cross-sectional view an exemplary electronic device having a low profile thermal flow assembly according to various embodiments of the present disclosure. Electronic device 600 can be identical or substantially similar to electronic device 200 above, only in fully assembled form. Electronic device 600 can thus have many or all of the same components of electronic device 200, such as, for example, upper enclosure 210, foot 220, power supply unit 212, multi-level board 230, heat transfer stage 240, fin stack 270, and impeller 281, among other items. Airflow 605 through the electronic device 600 can begin at inlet vent(s) 222 at an outer surface of foot 220, where it can proceed to fan assembly inlet(s) 285. In various embodiments, fan assembly inlet(s) 285 can be formed at interior surface(s) of foot 220. As noted above, airflow 605 can then proceed through the fan assembly, including impeller 281, and into fin stack 270, where the airflow 605 is heated through contact with heated fins. The airflow 605 can then exit the fan assembly at fan assembly outlet(s) 286, after which it can exit the entire electronic device at outlet vent(s) 224. Again, fan assembly outlet(s) can be formed at an interior surface of foot 220, while outlet vent(s) 224 can be formed at an outer surface of foot 220.

In general, much or all of airflow 605 is caused due to rotation of the fan, such as at impeller 281. This rotational fan operation pulls air into the top of the fan, pushes air out of the other side of the fan, and creates the rest of airflow 605 by extension, due to operation of the fan assembly. When considered with respect to the height and size of overall electronic device 600, the full path for airflow 605 through the electronic device occurs over a substantially level path from the inlet vents 222 to the outlet vents 224. That is to say, the airflow 605 only varies slightly up or down in a vertical or "z" direction during its entire passage through the electronic device 600. More particularly, airflow 605 is mostly or completely limited to the volume created for fan assembly 280. Accordingly, little to no airflow passes through the upper regions of electronic device 600, such as at multi-level board 230 or above. In some embodiments, designs can be implemented to allow for a small amount of air to leak into and traverse through these upper regions, whereby the small amount of air can then also be exhausted at outlet vents 224.

Figure 7:
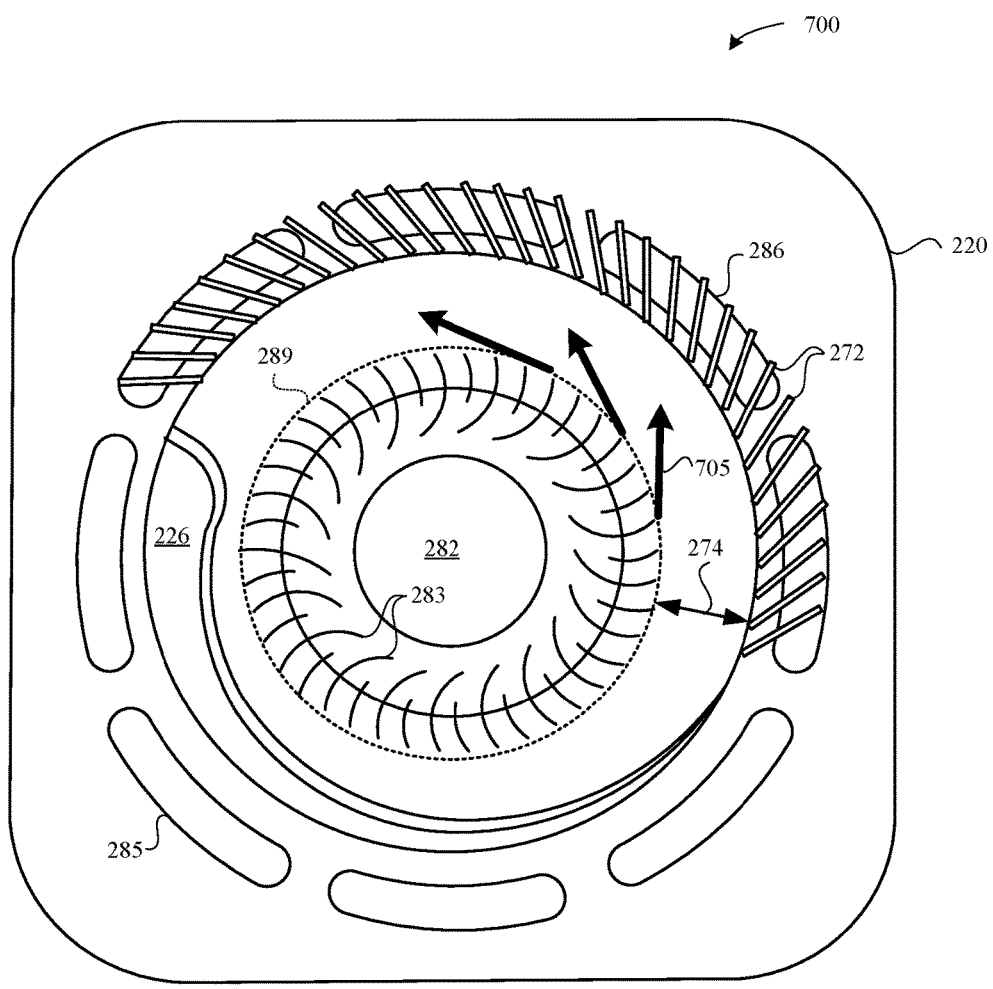
FIG. 7 illustrates in top perspective view an exemplary impeller and fin stack arrangement for an integrated fan assembly according to various embodiments of the present disclosure.

FIG. 7 illustrates in top perspective view an exemplary impeller and fin stack arrangement for an integrated fan assembly according to various embodiments of the present disclosure. Impeller and fin stack arrangement 700 can be set within a foot 220 of an outer device housing, which can include fan assembly inlets 285 and fan assembly outlets 286, as well as an impeller hub 282 and blades 283, which can define a specific blade circumference or diameter 289. A scroll profile 226 can be a contour that is integrally formed with or situated proximate to an internal portion of foot 220. This scroll profile 226 can define how air will flow and be controlled as it enters and proceeds through the impeller 281.

Airflow 705 proceeding through the impeller is then forced out of the impeller at the other side, where it passes between fins 272 of the fin stack 270. Distance 274 between the outer edge of impeller 281 and the fin stack 270 can determine various airflow properties, such as speed, direction and acoustic effects. In various embodiments, distance 274 can be adjusted or tuned so as to minimize acoustic effects of airflow 705 passing through the fan assembly. This can be done, for example, by increasing or decreasing the lengths of individual fins 272. Other items that can be adjusted to minimize or eliminate acoustic effects can include the impeller diameter 289, as well as the count and angles of impeller blades 283, and also the dimensions of scroll profile 226, among other items and features. In various embodiments, airflow 705 can exit impeller blades 283 tangentially, with the arrangement and angles of fins 272 set to account for such flow directions. Appropriate design of the arrangement and angles of fins 272 can then result in minimal changes in directional changes and turbulence as airflow 705 moves from impeller 281 to fin stack 270. This can also result in minimized acoustic effects, as well as streamlined and more efficient airflow 705 and heat exchanging.

Figure 8A:
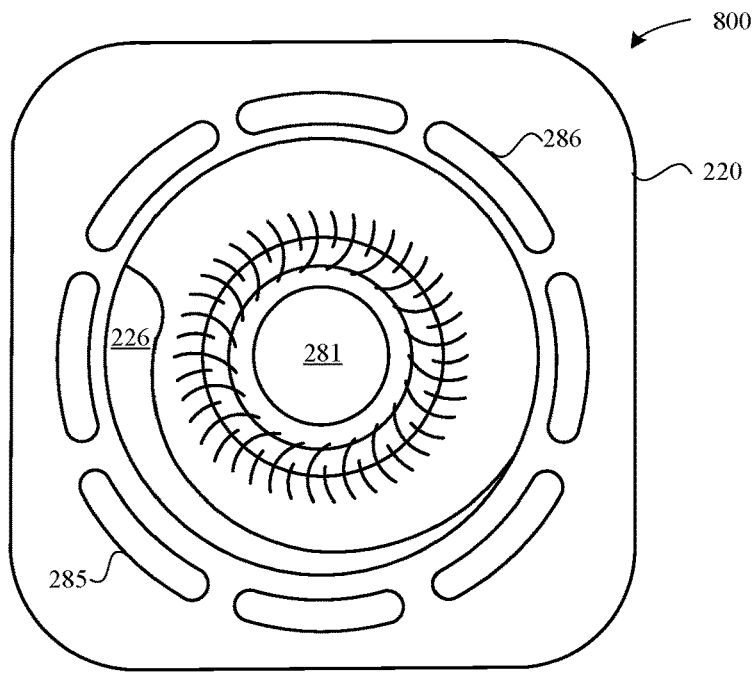
FIGS. 8A and 8B illustrate in bottom plan views exemplary foot and scroll geometries for an integrated fan assembly according to various embodiments of the present disclosure.
Figure 8B:
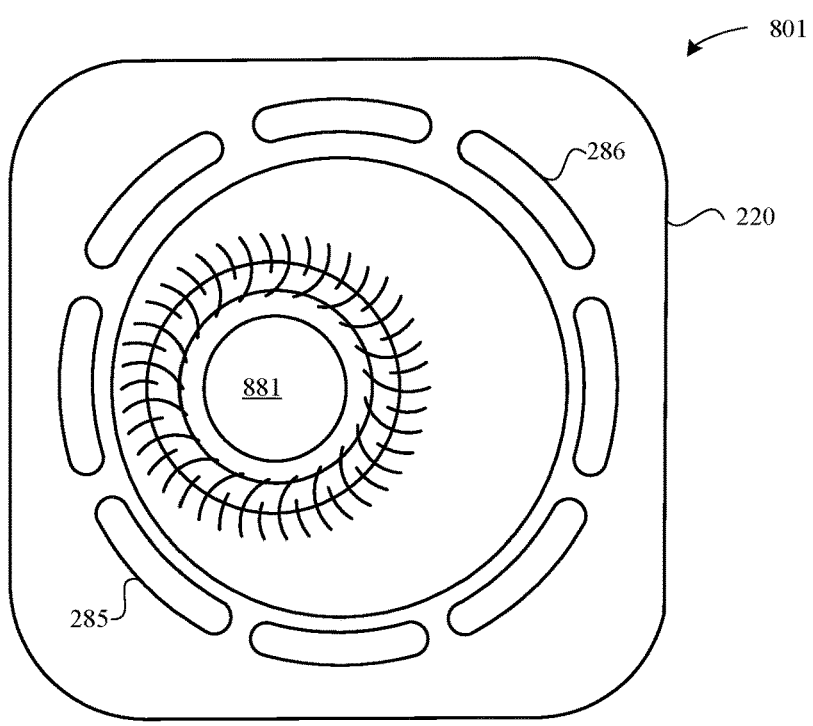

FIGS. 8A and 8B illustrate in bottom plan views exemplary foot and scroll geometries for an integrated fan assembly according to various embodiments of the present disclosure. FIG. 8A depicts a scroll geometry 800 similar to that which is set forth above, with an impeller 281 being disposed within a fan assembly integrated within a foot 220. Foot 220 can have various fan assembly inlets 285 and fan assembly outlets 286 that are integrally formed as part of the foot 220. As shown, impeller 281 can be concentrically located at the center of foot 220, such that the impeller is centered within all of the fan assembly inlets 285 and fan assembly outlets 286. As noted above with respect to FIG. 7, such a concentric arrangement may result in a need for a scroll profile 226 at or near the location where airflow enters the impeller 281, such as to create a throat or otherwise create a desirable pressure build up along the length of scroll profile 226. Such a feature can be preferable for the operation of an impeller and fan assembly in many instances.

Alternatively, FIG. 8B depicts a scroll geometry 801 that also includes an impeller 881 being disposed within a fan assembly integrated within a foot 220, which has various fan assembly inlets 285 and fan assembly outlets 286. Impeller 881 is located at an off-center position within foot 220, which can then result in an effective scroll profile at or near the location where airflow enters the impeller 881 without having to form such a scroll profile in the foot 220 or as another separate feature. This then results, however, in a loss of concentric design for the overall fan assembly, which may require design adjustments at other locations.

Figure 9:
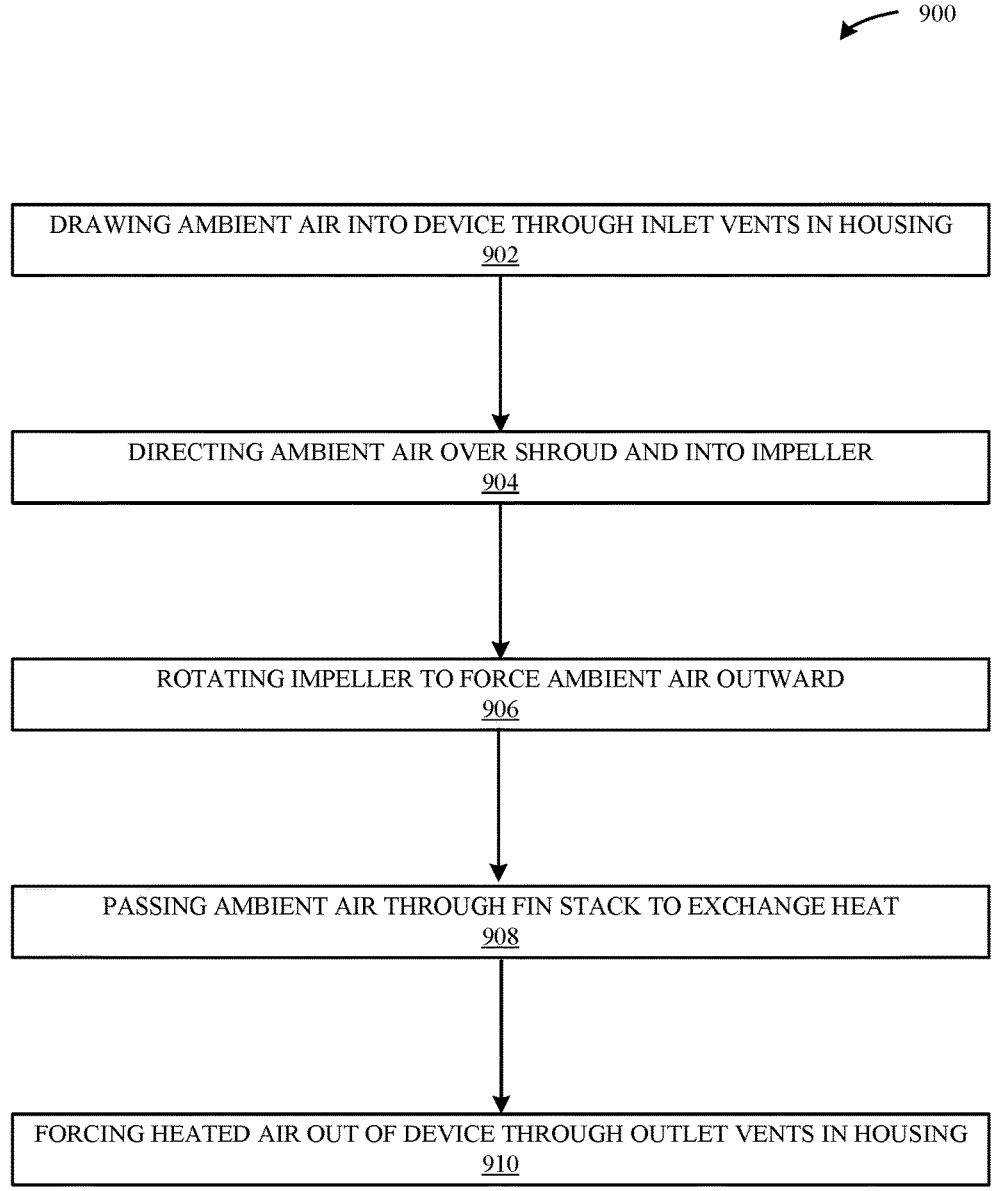
FIG. 9 illustrates a flowchart of an exemplary method of cooling an electronic device according to various embodiments of the present disclosure.

FIG. 9 illustrates a flowchart of an exemplary method of cooling an electronic device according to various embodiments of the present disclosure. Method 900 can be carried out at least in part by an associated processor or other controller that may be located on the electronic device for which cooling is to be provided, for example. Method 900 starts at process step 902, where ambient air can be drawn into the electronic device through one or more inlet vents in the housing. This can be done through vents in a housing foot, for example, such as that which is set forth above. At a following process step 904, the ambient air can be directed over a shroud and into an impeller. Again, this can be involve a shroud, impeller, and/or other related components such as those set forth above.

At a process step 906, the impeller can be rotated to force the ambient air outward therefrom. Such an impeller rotation can be controlled by an associated processor or other controller, such as one that might be located on the subject computing or electronic device. Rotating the impeller can also facilitate the performance of other process steps 902 through 910, such as through the creation of a continuous airflow and the contributions of component designs and arrangements, as will be readily appreciated. At a subsequent process step 908, the ambient air can be passed through a fin stack in order to exchange heat with one or more other electronic device components. The heated air can then be forced out of the electronic device through one or more outlet vents in the housing. Again, this can be done through vents in a housing foot, such as that which is set forth in greater detail above.

For the foregoing flowchart, it will be readily appreciated that not every step provided is always necessary, and that further steps not set forth herein may also be included. For example, added steps that involve sensing when cooling is needed may be added. Also, steps that provide more detail with respect to the design or assembly of the electronic device in a particular conducive manner may also be added. Furthermore, the exact order of steps may be altered as desired, and some steps may be performed simultaneously. In some embodiments, all of steps 902 through 910 may be performed at the same time for different portions of ambient and then heated air.

Figure 10:
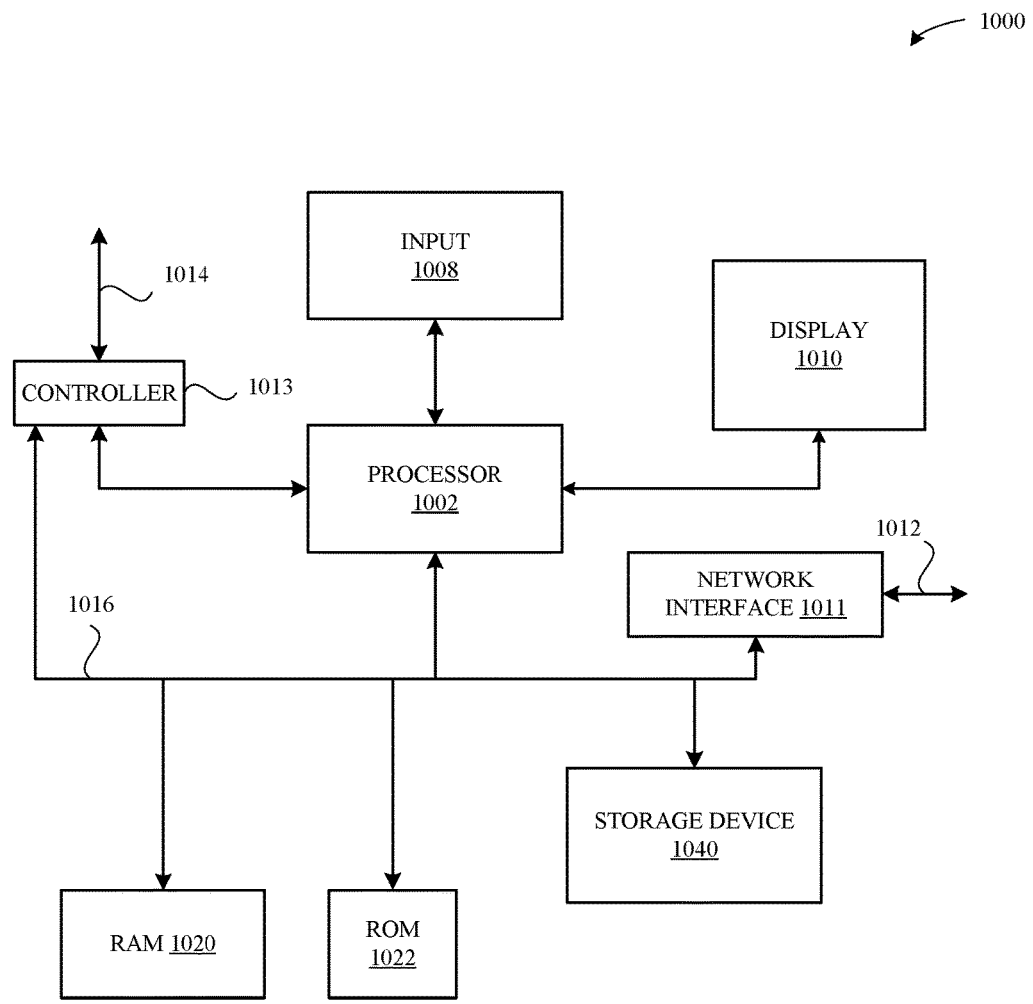
FIG. 10 illustrates in block diagram format an exemplary computing device that can be used to implement the various components and techniques described herein according to various embodiments of the present disclosure.

FIG. 10 illustrates in block diagram format an exemplary computing device 1000 that can be used to implement the various components and techniques described herein according to various embodiments of the present disclosure. In particular, the detailed view illustrates various components that can be included in the computing or electronic device 100 illustrated in FIG. 1, among other possible computing or electronic devices. As shown in FIG. 10, the computing device 1000 can include a processor 1002 that represents a microprocessor or controller for controlling the overall operation of computing device 1000. The computing device 1000 can also include a user input device 1008 that allows a user of the computing device to interact with the computing device 1000. For example, the user input device 1008 can take a variety of forms, such as a button, keypad, dial, touch screen, audio input interface, visual/image capture input interface, input in the form of sensor data, etc. Still further, the computing device 1000 can include a display 1010 (screen display) that can be controlled by the processor 1002 to display information to the user (for example, a movie or other AV or media content). A data bus 1016 can facilitate data transfer between at least a storage device 1040, the processor 1002, and a controller 1013. The controller 1013 can be used to interface with and control different equipment through and equipment control bus 1014. The computing device 1000 can also include a network/bus interface 1011 that couples to a data link 1012. In the case of a wireless connection, the network/bus interface 1011 can include a wireless transceiver.

The computing device 1000 can also include a storage device 1040, which can comprise a single disk or a plurality of disks (e.g., hard drives), and can include a storage management module that manages one or more partitions within the storage device 1040. In some embodiments, storage device 1040 can include flash memory, semiconductor (solid state) memory or the like. The computing device 1000 can also include a Random Access Memory (RAM) 1020 and a Read-Only Memory (ROM) 1022. The ROM 1022 can store programs, utilities or processes to be executed in a non-volatile manner. The RAM 1020 can provide volatile data storage, and stores instructions related to the operation of computing device 1000.

The various aspects, embodiments, implementations or features of the described embodiments can be used separately or in any combination. The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic device, comprising:
    an outer housing arranged to enclose and support a plurality of internal components, the outer housing including an upper enclosure and a foot coupled thereto, wherein the foot includes a plurality of inlet vents and outlet vents formed therein;
    a heat generating component located within the outer housing on a printed circuit board, the heat generating component including a bottom surface;
    a fan assembly integrated within the foot of the outer housing;
    a heat pipe in thermal contact with the fan assembly;
    a heat transfer stage disposed between the heat pipe and the bottom surface of the heat generating component; and
    a bottom shield disposed between and separating the fan assembly and the printed circuit board, wherein the bottom shield is configured to direct heat away from the heat generating component.

2. The electronic device of claim 1, wherein the fan assembly includes a shroud, and wherein the shroud is coupled to the foot and operates therewith to define the fan assembly inlet.

3. The electronic device of claim 2, wherein the shroud directs airflow from one or more of the plurality of inlet vents to an inlet of the fan assembly.

4. The electronic device of claim 1, wherein the fan assembly includes a fin stack, an outlet, and an impeller, and wherein the fin stack directs airflow from the impeller to the fan assembly outlet.

5. The electronic device of claim 4, wherein the fin stack is configured to direct heat away from the heat generating component.

6. The electronic device of claim 4, wherein the foot, the impeller, and a shroud of the fan assembly are concentrically arranged with respect to each other.

7. The electronic device of claim 1, wherein the heat pipe is configured to direct heat away from the heat generating component.

8. The electronic device of claim 7, wherein the heat transfer stage is characterized by a length and width that corresponds to a length and width of the heat generating component, wherein the heat transfer stage is configured to direct heat away from the heat generating component.

9. The electronic device of claim 4, wherein airflow through the electronic device due to operation of the fan assembly is directed across each of the fin stack, heat pipe, heat transfer stage, and bottom shield.

10. The electronic device of claim 1, wherein airflow through the electronic device due to operation of the fan assembly occurs over a substantially level path from the inlet vents to the outlet vents.

11. A thermal flow assembly configured for use in an electronic device, the thermal flow assembly comprising:
    a fan assembly including an inlet, an outlet, an impeller having a plurality of blades, and a shroud configured to direct airflow into the impeller, wherein the fan assembly is integrated within an outer housing component for the electronic device;
    a printed circuit board;
    a heat pipe in thermal contact with the fan assembly;
    a heat transfer stage disposed between the heat pipe the printed circuit board; and
    a bottom shield in thermal contact with the fan assembly and configured to separate the fan assembly from the printed circuit board.

12. The thermal flow assembly of claim 11, wherein a footprint for the fan assembly is the same as a footprint for the outer housing component.

13. The thermal flow assembly of claim 11, wherein the fan assembly further includes a fin stack.

14. The thermal flow assembly of claim 11, wherein the shroud is configured to direct incoming airflow over the shroud into the impeller and to direct outgoing airflow from the impeller under the shroud.

15. A method of cooling an electronic device, the method comprising:
    drawing ambient air into the electronic device through one or more inlet vents disposed in an outer housing of the electronic device;
    directing the ambient air over a shroud and into an impeller within the electronic device;
    rotating the impeller to force the ambient air outward therefrom;
    passing the ambient air through a fin stack, wherein heat is exchanged from one or more heated electronic device components to the ambient air via the fin stack, wherein the one or more heated electronic device components includes a component disposed on a printed circuit board, wherein the fan assembly is in thermal contact with a heat pipe, wherein a heat transfer stage is positioned between the heat pipe and the component disposed on the printed circuit board, and wherein a bottom shield separates the fan assembly from the printed circuit board; and
    forcing the heated ambient air out of the electronic device through one or more outlet vents disposed in the outer housing.

16. The method of claim 15, wherein the ambient air travels over a substantially level path from the one or more inlet vents to the one or more outlet vents.

17. The method of claim 15, wherein the shroud directs incoming airflow over the shroud into the impeller and directs outgoing airflow from the impeller under the shroud.

18. The thermal flow assembly of claim 11, wherein the outer housing component includes a foot positioned below the fan assembly, and wherein the foot defines inlet and outlet vents for the electronic device.

* * * * *